United States Patent [19]

Enomoto

[11] Patent Number: 5,658,813
[45] Date of Patent: Aug. 19, 1997

[54] METHOD FOR MANUFACTURING A SEMICONDUCTOR INTEGRATED CIRCUIT DEVICE HAVING A STACK GATE STRUCTURE

[75] Inventor: Shuichi Enomoto, Tokyo, Japan

[73] Assignee: NEC Corporation, Tokyo, Japan

[21] Appl. No.: 586,541

[22] Filed: Jan. 16, 1996

Related U.S. Application Data

[63] Continuation of Ser. No. 264,634, Jun. 23, 1994, abandoned.

[30] Foreign Application Priority Data

Jun. 28, 1993 [JP] Japan ................... 5-178524

[51] Int. Cl.$^6$ ........................... H01L 21/265
[52] U.S. Cl. ............... 438/258; 438/588; 438/594
[58] Field of Search .................. 437/43, 48, 52

[56] References Cited

U.S. PATENT DOCUMENTS

| | | | |
|---|---|---|---|
| 4,720,323 | 1/1988 | Sato | 437/43 |
| 4,775,642 | 10/1988 | Chang et al. | 437/43 |
| 4,804,637 | 2/1989 | Smayling et al. | 437/43 |
| 5,075,245 | 12/1991 | Woo et al. | 437/43 |
| 5,087,587 | 2/1992 | Wada et al. | 437/43 |
| 5,147,811 | 9/1992 | Sakagami | 437/43 |
| 5,153,144 | 10/1992 | Komori et al. | 437/43 |
| 5,188,976 | 2/1993 | Kume et al. | 437/43 |

FOREIGN PATENT DOCUMENTS

| | | |
|---|---|---|
| 0184768 | 10/1983 | Japan ................... 437/43 |
| 4-10662 | 1/1992 | Japan . |

Primary Examiner—Trung Dang

[57] ABSTRACT

After the surface of a semiconductor substrate is separated into a cell region and a peripheral region, a first conductive film is formed in the peripheral region, and a tunnel oxide film is formed in the cell region. Further there are sequentially grown a second conductive film for a floating gate, an intermediate insulating film and a third conductive film for a control gate which are sequentially and selectively etched in order of the third conductive film, the intermediate insulating film and the second conductive film using a mask. The surface of the semiconductor substrate in the peripheral region is protected by the first conductive film so that it can be prevented from be damaged. Thus, when the intermediate insulating film of a stack gate structure is etched, the surface of the semiconductor substrate in an active region is protected from damage.

5 Claims, 3 Drawing Sheets

METHOD FOR MANUFACTURING A SEMICONDUCTOR INTEGRATED CIRCUIT DEVICE HAVING A STACK GATE STRUCTURE

This is a continuation of application Ser. No. 08/264,634 filed on Jun. 23, 1994 now abandoned.

BACKGROUND OF THE INVENTION

1. Field of the Invention

The present invention relates to a method for manufacturing a semiconductor integrated circuit device, more particularly, to a method for manufacturing a semiconductor integrated circuit device having a stack gate structure.

2. Description of Related Art

A conventional method for manufacturing an EPROM (Erasable and Programmable Read Only Memory) having a stack gate structure in which a control gate is formed above a floating gate via an insulating film (to be referred to as an intermediate insulating film hereinafter) is disclosed in, for example, the Japanese Unexamined Patent Publication (JP-A-) 4-10662.

In this method, as shown in FIG. 1A, a peripheral region A and a cell region B are formed after a field oxide film 32 is formed on the surface of a p type silicon substrate 31. Then, an insulating film (tunnel oxide film) 33 is grown on the surface of each region and a polysilicon film 34 for formation of a floating gate is grown all over the surface. Subsequently, phosphorus is doped into the polysilicon film 34 and then the polysilicon film 34 is selectively etched so that the polysilicon film 34 for the floating gate is remaines in the cell region B. The tunnel oxide film 33 is etched using the floating gate 34 as a mask so that the silicon substrate 31 can be exposed in the peripheral region A. Then, thermal oxidation is performed to grow a gate insulating film 36 on the surface of the silicon substrate 31 in the peripheral region A and an intermediate insulating film 35 on the surface of the floating gate 34 in the cell region B.

As shown in FIG. 1B, a polysilicon film for formation of a gate electrode 37 and a control gate 37a is grown all over the surface and phosphorus is introduced into the polysilicon film on which a first protective oxide film 38 is formed to be a 2-layer film. Then, the 2-layer film is patterned in the peripheral region A and the cell region B so that the gate electrode 37 and a first protective oxide film 38 can be formed in the peripheral region A and the control gate 37a and the first protective oxide film 38 can be formed in the cell region B. Then, a resist layer 39 for forming a cell is formed in the cell region B such that the resist layer 39 covers the control gate 37a and the first protecting oxide film 38.

Next, as shown in FIG. 1C, the intermediate insulating film 35 and the floating gate 34 are etched using the resist layer 39 as a mask and then second protecting oxide films 40 are formed on the side surface of the gate electrode 37, the control gate 37a and the floating gate 34 by thermal oxidation. Subsequently, arsenic ions are implanted all over the surface so that n-type diffusion layers 41 are formed on the surface of the silicon substrate 31.

Thereafter, a BPSG interlayer film 42 is grown all over the surface as an interlayer insulating film. It should be noted that although not shown in the figures contact holes are formed on the gate electrode 37, the control gate 37a and the n-type diffusion layers 41 so that the EPROM is completed by formation of aluminum wirings.

In the above method, the insulating film between the floating gate 34a and the control gate 37a, i.e., the intermediate insulating film 35, is formed on the surface by performing the thermal oxidation for the polysilicon film for formation of the floating gate 34. Such an intermediate insulating film 35 formed by the thermal oxidation is not preferable for a highly integrated EPROM because the film 35 becomes thick because of the thermal oxidation for the polysilicon film including impurity and the film thickness control is wrong.

For this reason, intermediate insulating film has been used a laminate film formed by sandwiching a SiN (silicon nitride) film, which is formed by a CVD method, between SiO films (silicon oxide films).

In a case that such a laminate film is employed as the above EPROM intermediate insulating film 35, because the insulating film is unnecessary to the peripheral region A, the surface of the silicon substrate 31 should be exposed in the peripheral region A. Therefore, after the polysilicon film 34 is formed as shown in FIG. 1A, the laminate film is formed all over the surface, then the laminate film is etched using the resist pattern covering the cell region B. Then a gate insulating film 36 is formed by performing thermal oxidation for the surface of the silicon substrate 31 thus exposed.

However, if the method is employed, there is caused a problem that when the etching selection ratio of the nitride film against the oxide film thereunder is not great in etching the laminate film constituted of the nitride film and the oxide films, the oxide film is also etched in the peripheral region A in addition to the nitride film to further etch the surface of the silicon substrate 31 so that the surface of the peripheral region A is damaged to cause the leakage in a p-n junction to be formed thereafter. This problem is caused even when the etching selection ratio between the nitride film and the oxide film is great, so that the surface of the silicon substrate in the peripheral region A is damaged because the lower oxide film is thin to be a few tens Å with less etching margin.

SUMMARY OF THE INVENTION

An object of the present invention is to provide a method for manufacturing a semiconductor device in which damage to the surface of an active region of a semiconductor substrate can be prevented in etching the intermediate insulating film.

In the present invention, the semiconductor substrate is separated into a cell region and a peripheral region, a first conductive film is formed in the peripheral region, and further there are sequentially grown a second conductive film, an intermediate insulating film and a third conductive film which are sequentially etched to form a control gate, an intermediate insulating film and a floating gate. In this case, since there is under the intermediate film the second conductive film which is continuously etched, the surface of the semiconductor substrate in the peripheral region is not damaged with the etching even if the second conductive film is etched in etching of the intermediate insulating film. In addition, because the etching margin of the intermediate film can be made great, the surface of the semiconductor substrate can be prevented from being damaged.

In this manner, a semiconductor integrated circuit device can be manufactured in which the leak in the diffusion layer of a gate structure element formed in the peripheral region, e.g., a MOS transistor can be prevented.

DETAILED DESCRIPTION OF THE PREFERRED EMBODIMENTS

The embodiments of the present invention will be described with reference to the accompanying drawings.

Figure 1A:
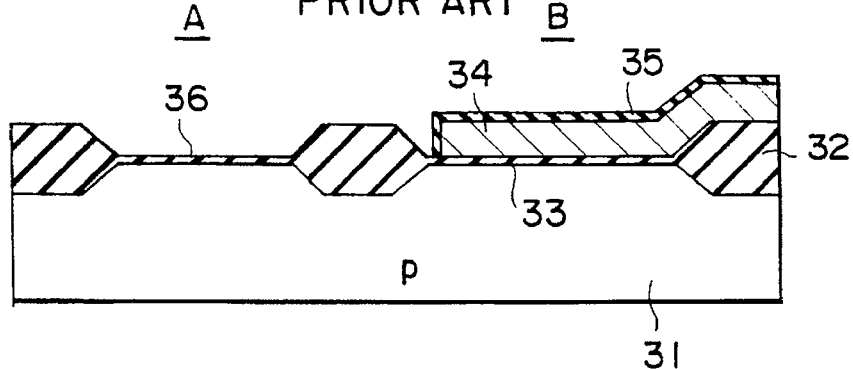
FIGS. 1A to 1C are cross sectional views showing processes in a conventional manufacturing method.
Figure 1B:
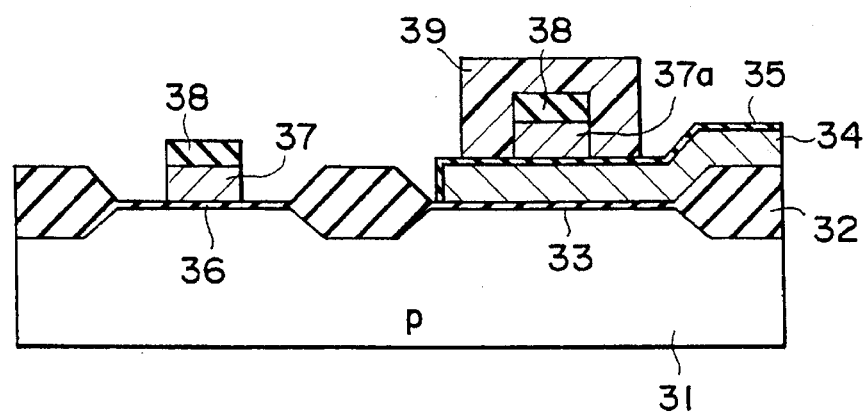
Figure 1C:
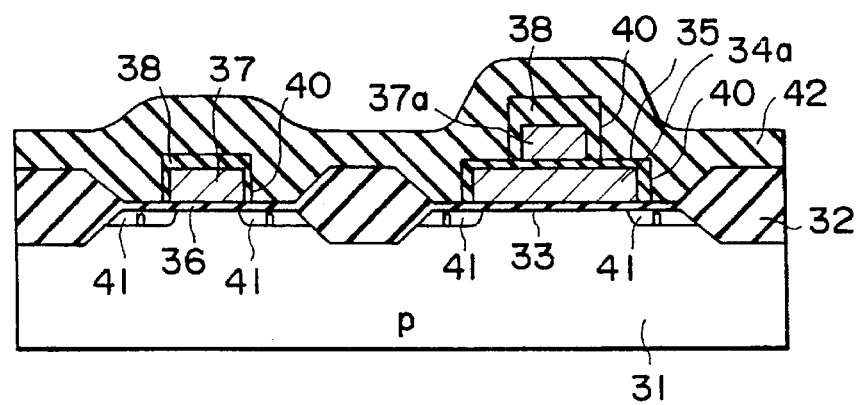
Figure 2A:
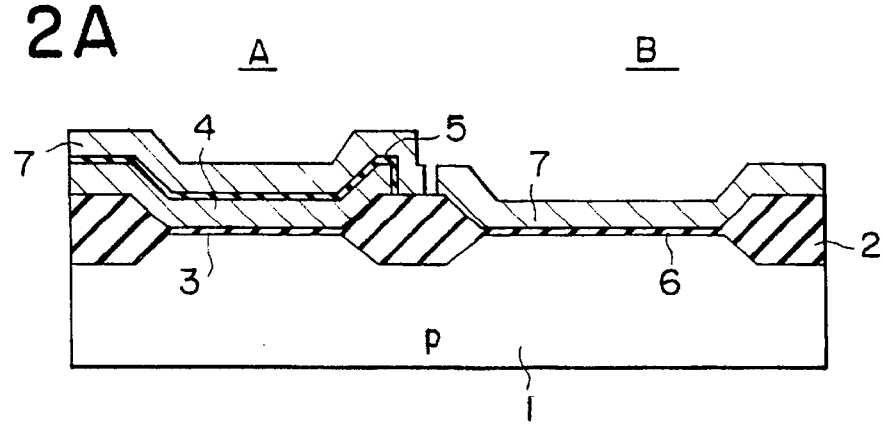
FIGS. 2A to 2D are cross sectional views showing processes in the first embodiment of the present invention.

FIGS. 2A to 2D are cross sectional views showing the manufacturing processes in the first embodiment of the present invention. First, as shown in FIG. 2A, after a field oxide film 2 of, for example, 5000 Å in thickness is selectively formed on a p-type silicon substrate 1 and element separation is performed by the field oxide film 2, a gate oxide film 3 of, for example, 150 Å in thickness is formed, in a peripheral region A, and a cell region B on the surface of the silicon substrate 1 by thermal oxidation. Next, a polysilicon film 4 of, for example, 3000 Å in thickness is grown all over the surface and phosphorus is introduced into the polysilicon film 4. Then the polysilicon film 4 is selectively etched such that the entire peripheral region A is covered with the polysilicon film 4 and the polysilicon film 4 is removed in the cell region B. Further, the gate oxide film 3 in the cell region B is etched such that the surface of the silicon substrate 1 is exposed. Then thermal oxidation is performed to form a first protective oxide film 5 on the surface of the polysilicon film 4 for the gate electrode in the peripheral region A and to form a tunnel oxide film 6 of, for example, 100 Å in thickness on the surface of the silicon substrate 1 in the cell region B.

Next, a polysilicon film 7 of, for example, 1500 Å in thickness is grown all over the surface and after phosphorus is introduced into the polysilicon film 7, the polysilicon film 7 is etched such that the polysilicon film 4 and the first protective oxide film 5 are covered by the polysilicon film 7 in the peripheral region A and the polysilicon film 7 remains in a predetermined region of the cell region B.

Figure 2B:
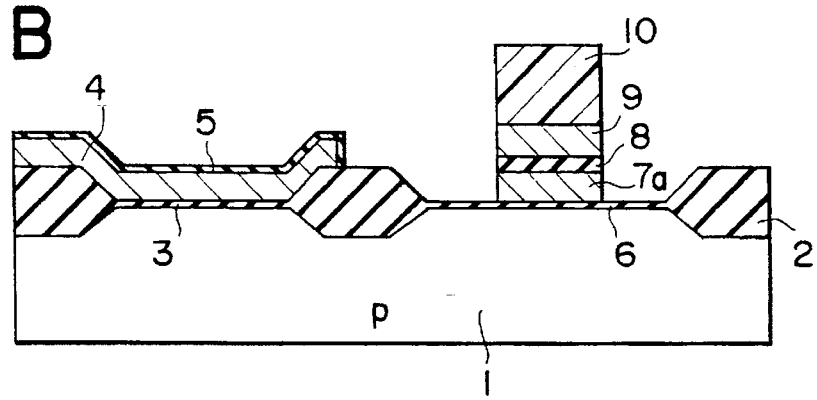

Next, as shown in FIG. 2B, an intermediate insulating film 8 and a polysilicon film for formation of a control gate 9 of, for example, 2000 Å in thickness are sequentially grown and phosphorus is introduced into the polysilicon film for formation of a control gate 9. A resist pattern 10 is selectively formed on a gate forming region of the cell region B and the control gate 9, the intermediate insulating film 8 and the floating gate 7a are formed by continuous etching using the resist pattern as a mask. As a result of this etching, the intermediate insulating film 8, the polysilicon film 9 and the polysilicon film 7 are all removed so that the polysilicon film 4 for the formation of the gate electrode covered with the first protecting insulating film 5 is left in the peripheral region A because the resist pattern 10 is not formed there.

Here, the intermediate insulating film 8 is constructed to have a laminate film structure of oxide film/nitride film/ oxide film which are sequentially grown with thicknesses of, for example, 80 Å, 100 Å and 80 Å by a CVD method, respectively.

Figure 2C:
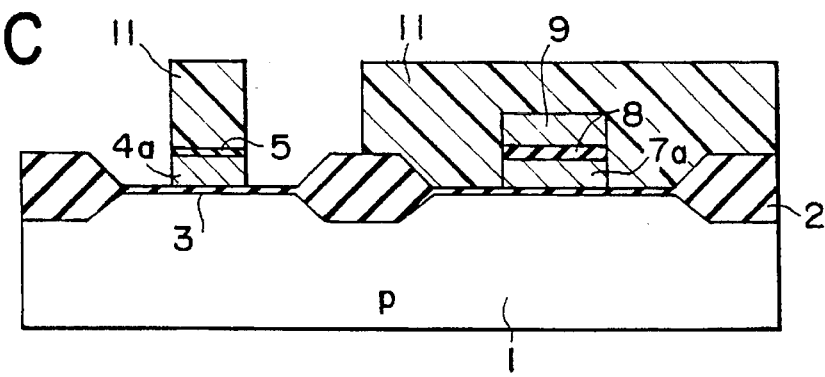

Next, as shown in FIG. 2C, after the resist pattern 10 is removed, a resist pattern 11 is formed to cover the entire cell region B and a region of the peripheral region A corresponding to the gate electrode. Then, the first protecting insulating film 5 and the polysilicon film 4 are etched using the resist pattern 11 as a mask so that the gate electrode 4a can be selectively formed in the peripheral region A.

Figure 2D:
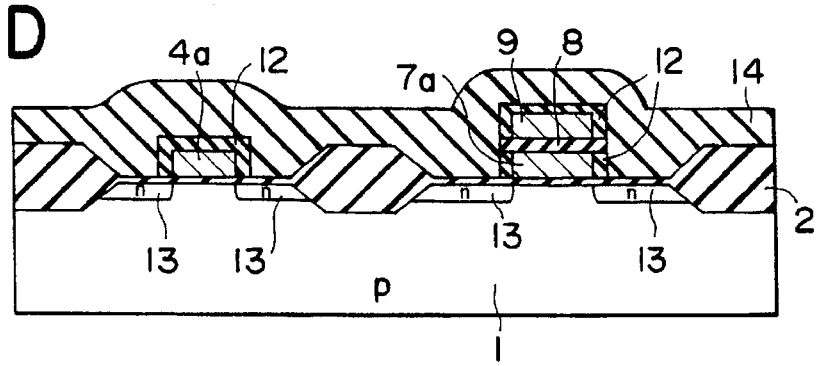

Thereafter, as shown in FIG. 2D, the resist pattern 11 is removed and thermal oxidation is performed to form a second protecting insulating film 12 on the surface of each of the gate electrode 4a, the floating gate 7a and the control gate 9. Further, arsenic ions are implanted all over the surface to form n-type diffusion layers 13 at the surface of the silicon substrate 1. Thereafter, a BPSG interlayer film 14 is grown all over the surface. Then, although not shown in the figures, contact holes are formed on the gate electrode 4a, the control gate 9 and the n-type diffusion layers 13 so that the EPROM is completed by formation of aluminum wirings.

In the above method, as particularly shown in FIG. 2B, even if the nitride film of the intermediate insulating film 8 is overetched in etching the film 8 to further etch the oxide film under the nitride film, there is caused no problem. That is, because there is the polysilicon film 7 for the formation of the floating gate to be further etched under the intermediate insulating film 8, even if the lower oxide film of the intermediate insulating film 8 is etched and the polysilicon film 7 under the oxide film is etched, the surface of the silicon substrate 1 is not etched so that damage to the surface of the silicon substrate 1 can be prevented. It should be noted that since the etching selection ratio between the polysilicon film and the oxide film is great, the surface of the silicon substrate is not damaged in the etching of the polysilicon film 7 for the floating gate.

Figure 3A:
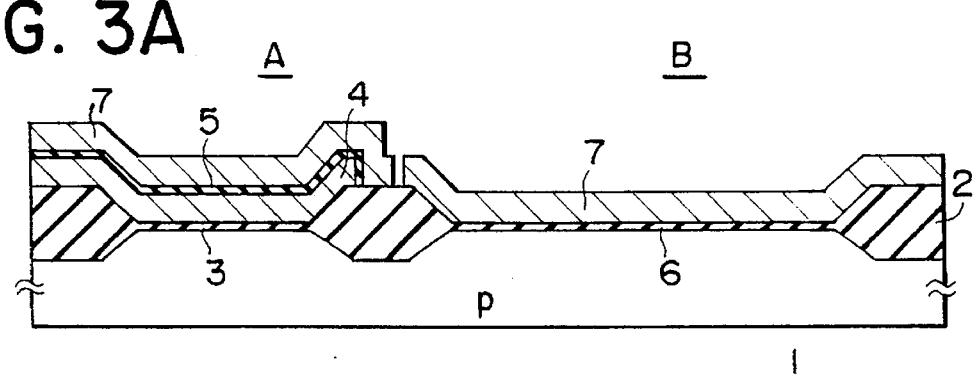
FIGS. 3A to 3D are cross sectional views showing processes in the second embodiment of the present invention.

FIGS. 3A to 3D are cross sectional views showing the manufacturing processes of the second embodiment of the present invention. The cross sectional structure shown in FIG. 3A is manufactured with the same processes as those of the above first embodiment associated with FIG. 2A.

Figure 3B:
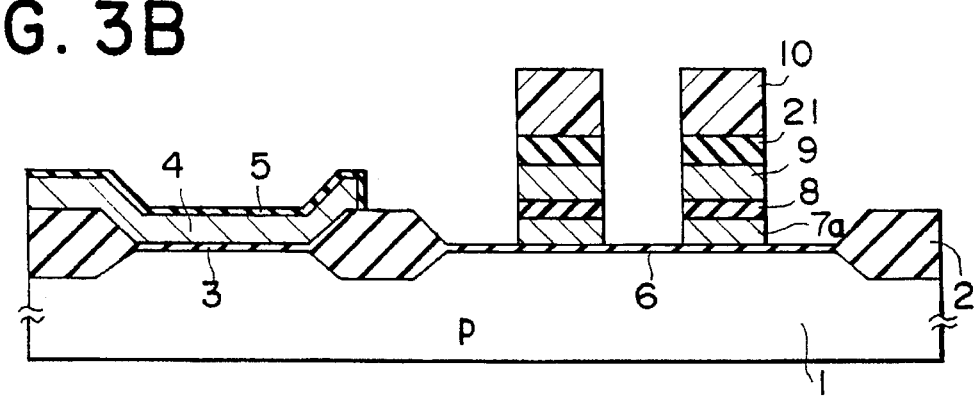

Then, as shown in FIG. 3B, the intermediate insulating film 8 and a polysilicon film for the formation of a control gate 9 are sequentially grown and phosphorus is introduced into the polysilicon film. A third protecting oxide film 21 of, for example, 2000 Å in thickness is grown on the polysilicon film for the control gate 9. The third protecting oxide film 21, the control gate 9, the intermediate insulating film 8 and the floating gate 7a are formed by continuous etching using a resist pattern 10 as a mask. In this time, a polysilicon film 4 for the formation of the gate electrode covered with the first protecting insulating film 5 is left in the peripheral region A.

Figure 3C:
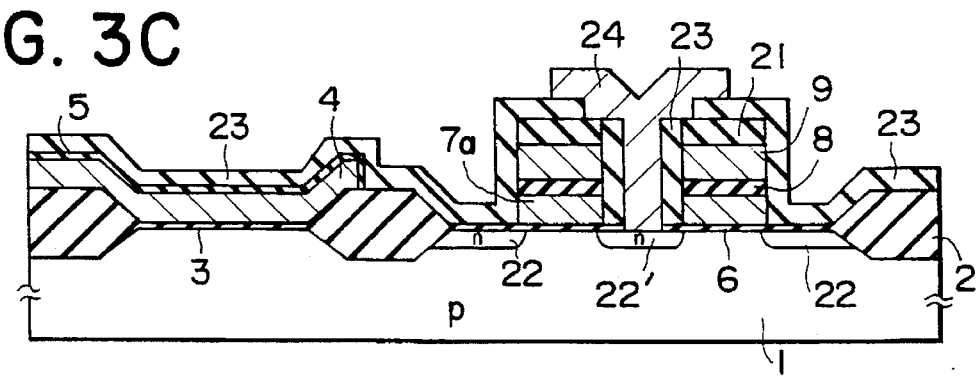

Next, as shown in FIG. 3C, after the resist pattern 10 is removed, arsenic ions are implanted all over the surface to form n-type diffusion layers 22 and 22' at the surface of the silicon substrate 1. Subsequently, a high temperature oxide film (HTO) of, for example, 2000 Å is grown all over the surface by a CVD method as a first interlayer film 23 and then a portion of the first interlayer film 23 on the n-type diffusion layer 22' is removed with anisotropic etching. A resist pattern for openings used in this case need not to cover a portion of the third protecting oxide film 21 (self-alignment opening method: an SAC method). For instance a WSi (tungsten silicide) wiring pattern 24 is formed so that the exposed n-type diffusion layer 22' is covered.

Figure 3D:
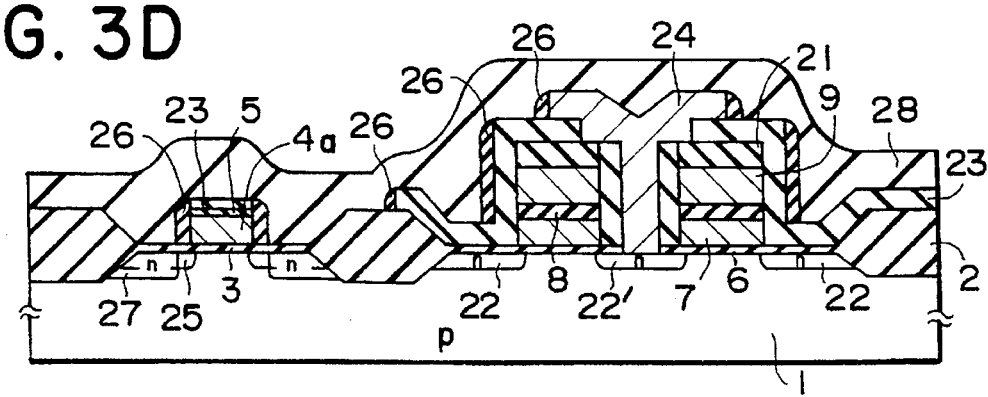

Thereafter, as shown in FIG. 3D, a resist pattern is formed to cover the cell region B and a gate forming region of the peripheral region A which is used as a mask for etching the first interlayer film 23, the first protecting oxide film 5 and the polysilicon film 4 to form the gate electrode 4a in the peripheral region A. Then, after the resist pattern is removed, phosphorus is introduced into the silicon substrate 1 to form n⁻-type diffusion layers 25. Again, an HTO film is grown all over the surface and anisotropic etching is performed for all the surface so that side wall oxide films 26 are left on the sides of the gate electrode 4a in the peripheral region A and the sides of the first interlayer film 23 and the wiring pattern 24 in the cell region B. Subsequently, arsenic ions are implanted all over the surface to form n-type diffusion layer 27. Further, a BPSG interlayer film 28 of, for example, 7000 Å in thickness is grown all over the surface. Then, although not shown in the figures, contact holes are formed on the gate electrode 4a, the control gate 9, the n-type diffusion layers 22 and 27 and the WSi wiring pattern 24 so that the EPROM is completed by formation of aluminum wirings.

Even in the second embodiment, even if a margin is small in etching the intermediate insulating film 8, because there is the polysilicon film 7 under the intermediate insulating film 8 in the peripheral region A, the polysilicon film 7 is continuously etched only so that the surface of the silicon substrate can be prevented from being damaged.

It should be noted that although the present invention is applied to the EPROM in the above embodiments, it may be applied to a flash type EEPROM having the stack cell structure, needless to say.

Further, the intermediate insulating film is not limited to the above multilayer structure and even if the present invention is applied to the intermediate insulating film of the single layer structure the advantage can be obtained.

What is claimed is:

1. A method for manufacturing a semiconductor integrated circuit device having a stack gate structure, comprising the steps of:

separating a surface of a semiconductor substrate into a cell region and a peripheral region;

forming a gate insulating film and a first conductive film on the gate insulating film in the peripheral region; and performing, subsequent to the above steps, the following steps:

forming a tunnel oxide film in the cell region;

sequentially growing a second conductive film for a floating gate, an intermediate insulating film and a third conductive film for a control gate all over the surface including the cell region and the peripheral region; and selectively forming a mask in the cell region to sequentially etch the third conductive film, the intermediate insulating film and the second conductive film using the mask so that a cell having a stack gate structure is formed in the cell region; and, subsequent to the steps above, patterning the gate insulating film and the first conductive film formed in the peripheral region to form a peripheral gate.

2. A method according to claim 1, wherein the intermediate insulating film is a multilayer film which includes a nitride film.

3. A method for manufacturing a semiconductor integrated circuit having a stack gate structure, comprising the steps of:

separating a surface of a semiconductor substrate into a cell region and a peripheral region;

forming a gate insulating film and a first conductive film for a gate electrode on the gate insulating film in the peripheral region and subsequently forming a tunnel oxide film in the cell region;

sequentially growing a second conductive film for a floating gate, an intermediate insulating film and a third conductive film for a control gate all over the surface including the cell region and the peripheral region;

selectively forming a first mask in the cell region to sequentially perform selective etching of the third conductive film using the first mask, so that a cell having a stack gate structure is formed in the cell region; and, subsequent to performing the steps above, selectively forming a second mask in the peripheral region to perform selective etching of the first conductive film using the second mask to form a gate electrode in the peripheral region.

4. A method according to claim 3, wherein the intermediate insulating film is a multilayer film which including a nitride film.

5. A method for manufacturing a semiconductor integrated circuit device having a stack gate structure, comprising the steps of:

separating a surface of a semiconductor substrate into a cell region and a peripheral region;

forming a gate insulating film and a first conductive film for a gate electrode on the gate insulating film in the peripheral region and subsequently forming a tunnel oxide film in the cell region;

sequentially growing a second conductive film for a floating gate, an intermediate insulating film and a third conductive film for a control gate all over the surface including the cell region and the peripheral region;

selectively forming a first mask in the cell region to sequentially perform selective etching of the third conductive film, the intermediate insulating film and a second conductive film using the first mask, so that a cell having a stack gate structure is formed in the cell region;

forming diffusion layers at the surface of said semiconductor substrate by ion-implantation;

forming a first interlayer film on the whole surface, then a portion of the first interlayer film on the diffusion layer being removed with anisotropic etching; and, subsequent to performing the steps above:

forming a wiring pattern so as to contact to said diffusion layer; and selectively forming a second mask in the peripheral region to perform selective etching of the first conductive film using the second mask to form a gate electrode in the peripheral region.

\* \* \* \* \*